(12) United States Patent
Inai et al.

(10) Patent No.: US 7,208,777 B1
(45) Date of Patent: Apr. 24, 2007

(54) FIELD-EFFECT SEMICONDUCTOR DEVICE

(75) Inventors: Makoto Inai, Omihachiman (JP); Hidehiko Sasaki, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 237 days.

(21) Appl. No.: 09/658,732

(22) Filed: Sep. 11, 2000

(30) Foreign Application Priority Data

Sep. 9, 1999 (JP) .................................. 11-256059

(51) Int. Cl.
*H01L 31/00* (2006.01)
(52) U.S. Cl. ...................................... 257/194; 257/192
(58) Field of Classification Search ................ 257/192, 257/194
See application file for complete search history.

(56) References Cited

U.S. PATENT DOCUMENTS

| 5,404,032 A * | 4/1995 | Sawada et al. ............. 257/192 |
| 6,605,831 B1 | 8/2003 | Inai et al. |

FOREIGN PATENT DOCUMENTS

| JP | 2-285682 | 11/1990 |
| JP | 6-252175 | 9/1994 |
| JP | 7-147395 | 6/1995 |
| JP | 9-232336 | 9/1997 |
| JP | 10-056168 | 2/1998 |
| JP | 11-177079 | 7/1999 |

OTHER PUBLICATIONS

Enoki, "Delay Time Analysis for 0.4- to 5-micron-Gate InAlAs-InGaAs HEMT's," IEEE Electron Device Letters 11 (1990) Nov., No. 11, pp. 502-504.*
Makoto Inai, et al. "Doped Channel HFET with Effective Lateral Energy Modulation for High Power Enhancement Operation", Extended Abstracts of the 1998 International Conference on Solid State Devices and Materials, Hiroshima, 1998, pp. 328-329.
M. Sawada, et al. "A Super Low-Noise AlGaAs/InGaAs/GaAs DC-HFET with 0.15 μm Gate-Length", Japanese Journal of Applied Physics, Supplements, Extended Abstracts of the 1991 International Conference on Solid State Devices and Materials (SSDM '91), Yokohama, Japan, Aug. 27-29, 1991, pp. 353-355; and.
P. P. Ruden, et al., "AlGaAs/InGaAs/GaAs Quantum Well Doped Channel Heterostructure Field Effect Transistors", IEEE Transactions on Electron Devices, vol. 37, No. 10, Oct. 1990, pp. 2171-2175.
Japanese Examination Report dated Aug. 6, 2002, along with an English translation.

* cited by examiner

*Primary Examiner*—N. Drew Richards
(74) *Attorney, Agent, or Firm*—Keating & Bennett, LLP

(57) ABSTRACT

The field-effect semiconductor device includes a channel layer; a contact layer; a semiconductor structure having an electron-affinity different from those of the channel layer and the contact layer and formed between the channel layer and the contact layer; an ohmic electrode formed on the contact layer; and a Schottky electrode formed on the semiconductor structure. The junction face between the channel layer and the semiconductor structure and the junction face between the contact layer and the semiconductor structure are iso-type heterojunctions.

12 Claims, 5 Drawing Sheets

FIELD-EFFECT SEMICONDUCTOR DEVICE

BACKGROUND OF THE INVENTION

1. Field of the Invention

The present invention relates to field-effect semiconductor devices, and more specifically, it relates to a field-effect semiconductor device having a heterojunction structure such as an HEMT structure or a DCHFET structure.

2. Description of the Related Art

Hitherto, as transistor devices operating in the region from microwaves to millimeter waves, a field-effect transistor having a heterojunction structure (hereinafter referred to as a heterojunction FET) has been used. In accordance with doped structures, the heterojunction FETs can be roughly classified into HEMTs (high-electron-mobility transistors) using a modulation-doped structure and DCHFETs (doped-channel heterojunction FETs) using a channel-doped structure. In this connection, the latter DCHFET is also called a DMT, an MISFET, an HIGFET, and the like.

FIG. 1 is a schematic cross-sectional view showing a semiconductor structure of a conventional HEMT. In an HEMT 1, a buffer layer 3 is formed on a semi-insulating gallium arsenide (GaAs) substrate 2, a channel layer 4 composed of undoped indium gallium arsenide (InGaAs) is formed on the buffer layer 3, and a barrier layer 5 is formed on the channel layer 4. The barrier layer 5 in FIG. 1 is a bi-layer structure composed of an n-type aluminum gallium arsenide (AlGaAs) layer (an electron-supplying layer) 5a and an undoped AlGaAs layer 5b. However, the barrier layer 5 may be a multi-layered structure composed of, for example, an undoped AlGaAs layer, an n-type AlGaAs layer, and an undoped AlGaAs layer, or it may only be an n-type AlGaAs layer. On the barrier layer 5, in order to form good ohmic contacts with a source electrode 8 and a drain electrode 9, a contact layer 6 composed of n-type GaAs is formed. On the upper surface of the contact layer 6, the drain electrode 9 and the source electrode 8 are formed and are brought into ohmic contact with the contact layer 6 by heat treatment.

Between the source electrode 8 and the drain electrode 9, the contact layer 6 is etched to form a recess therein so as to expose the barrier layer 5. The recess is formed by selectively removing the contact layer 6 by etching using an etchant that does not etch AlGaAs but etches GaAs, and by terminating the etching at the barrier layer 5 composed of AlGaAs. A gate electrode 10 is formed on the upper surface of the barrier layer 5 exposed from the contact layer 6 in a recess 7 and is in Schottky contact with the barrier layer 5. In addition, the surface of the HEMT 1 is covered with a protective layer 11 composed of SiN (silicon nitride).

In the HEMT structure described above, electrons in the n-type barrier layer 5 move over the heterojunction between the AlGaAs and the InGaAs to the channel layer 4 side that is lower in terms of energy. The electrons (two-dimensional electron gas) thus supplied from the barrier layer 5 to the highly purified channel layer 4 can drift without being scattered by donors in the barrier layer 5, so that the electrons have high mobility. That is, the channel layer 4 functions as a channel in which electrons flow, and the barrier layer 5 functions as a supplying source for supplying electrons to the channel layer 4, whereby, when a potential difference is applied between the source electrode 8 and the drain electrode 9, a drain current flows in the channel layer 4.

FIG. 2 is a schematic cross-sectional view showing a laminated structure of a conventional DMT. In a DMT 21 as shown in the figure, a buffer layer 23 is formed on a GaAs substrate 22, a channel layer 24 composed of n-type InGaAs is formed on the buffer layer 23, and a barrier layer 25 is formed on the channel layer 24. The barrier layer 25 in the DMT structure is formed of an undoped AlGaAs layer. On the barrier layer 25, in order to form good ohmic contacts with a drain electrode 29 and a source electrode 28, a contact layer 26 composed of n-type GaAs is formed. On the upper surface of the contact layer 26, the drain electrode 29 and the source electrode 28 are formed and are brought into ohmic contact with the contact layer 26 by heat treatment.

Between the source electrode 28 and the drain electrode 29, the contact layer 26 is selectively etched to form a recess therein so as to expose the barrier layer 25. A gate electrode 30 is formed on the upper surface of the barrier layer 25 exposed from the contact layer 26 in a recess 27 and is in Schottky contact with the barrier layer 25. In addition, the surface of the DMT 21 is covered with a protective layer 31 composed of SiN.

In the DMT structure described above, in the state in which a voltage is not applied to the gate electrode 30, electrons are stored in the n-type channel layer 24, and when a potential difference is applied between the source electrode 28 and the drain electrode 29 in this state, electrons as carriers move from the source electrode 28 to the drain electrode 29, so that a drain current flows.

In the HEMT 1 as described above, at the junction face between the channel layer 4 and the barrier layer 5, the combination thereof is an undoped layer and an n-type layer, respectively, and at the junction face between the contact layer 6 and the barrier layer 5, the combination thereof is an n-type layer and an undoped layer, respectively, so that each junction face has an aniso-type heterojunction. In addition, in the DMT 21 described above, at the junction face between the channel layer 24 and the barrier layer 25, the channel layer 24 is an n-type layer and the barrier layer 25 is an undoped layer, and at the junction face between the contact layer 26 and the barrier layer 25, the contact layer 26 is an n-type layer and the barrier layer 25 is an undoped layer, so that each junction face has an aniso-type heterojunction. As described above, in the conventional heterojunction FET, at least one of the junction faces between the channel layer and the barrier layer and between the barrier layer and the contact layer has an aniso-type heterojunction.

An aniso-type heterojunction is a junction formed of semiconductors having conduction types different from each other, or a junction formed of materials having electrical conductances significantly different from each other. For example, a junction formed of an n-type semiconductor and a p-type semiconductor, a junction formed of an n-type semiconductor and an undoped semiconductor, a junction formed of a p-type semiconductor and an undoped semiconductor, and a junction formed of a heavily doped layer ($n^+$, $p^+$) and a lightly doped layer ($n^-$, $p^-$) may be mentioned. In this connection, a heterojunction is a junction formed of materials having physical characteristics different from each other, for example, electron affinity and band-gap. In addition, heterojunctions other than aniso-type heterojunctions are called iso-type heterojunctions.

FIGS. 3A and 3B each show the energy band structure of the conduction band in the vicinity of the aniso-type heterojunction in the thermal equilibrium. FIG. 3A shows the energy level at the heterojunction face formed of an n-type GaAs layer 36 (or n-type InGaAs) and an undoped AlGaAs layer 37. In addition, FIG. 3B shows the energy level at the heterojunction face formed of undoped GaAs 38 (or undoped InGaAs) and an n-type AlGaAs layer 39, in which the conduction types in the top layer and the bottom layer in FIG. 3A are reversed.

When the heterojunction between a barrier layer and a semiconductor layer in contact therewith is an aniso-type conduction type pair, the bottom of the conduction band is localized at one side of the Fermi level $E_F$, and the distribution of the depletion layer is also localized at the undoped layer side. For example, in the example shown in FIG. 3A, that is, when the aniso-type heterojunction formed of the n-type GaAs layer 36 (or n-type InGaAs) and the undoped AlGaAs layer 37 is considered, since the undoped layer is composed of AlGaAs having a smaller electron-affinity, the barrier height $H_B$ (energy barrier above the Fermi level $E_F$) formed at the heterojunction face is higher, so that the resistance through the heterojunction is increased. In addition, as shown in FIG. 3B, when the undoped layer is composed of GaAs (or undoped InGaAs) having a smaller electron-affinity similar to that in the n-type AlGaAs layer 39/the undoped GaAs layer 38 (or undoped InGaAs), the width $W_v$ of the depletion layer formed at the n-type AlGaAs layer 39 side is increased, and also in this case, the resistance through the heterojunction is increased.

Consequently, in the aniso-type junction between the contact layer 6 (n-type GaAs) and the barrier layer 5 (undoped AlGaAs) in the HEMT 1 having a conventional structure, the barrier height at the barrier layer side is increased (see FIG. 3A). In addition, in the aniso-type junction between the barrier layer 5 (n-type AlGaAs) and the channel layer 4 (undoped InGaAs) in the conventional HEMT 1, the resistance in the undoped channel layer is increased while the width of the depletion layer generated in the barrier layer is increased (see FIG. 3B). Accordingly, the series resistance between the source and drain regions and the channel region under the gate electrode is increased.

On the other hand, in the conventional DMT 21, in the aniso-type junction between the contact layer 26 (n-type GaAs) and the barrier layer 25 (undoped AlGaAs) and also in the aniso-type junction between the channel layer 24 (n-type InGaAs) and the barrier layer 25 (undoped AlGaAs), since the barrier layer 25 is an undoped layer, band gap differences in the conduction band are almost distributed above the Fermi level and the barrier height is increased (see FIG. 3A), resulting in an increase in the series resistance which greater than that in the HEMT structure.

When the barrier height in the thermal equilibrium is high, the amount of increase and decrease in the barrier height is larger when the applied voltage is increased and decreased, and as a result, there is problems in that phenomena such as a drain current kink (see FIG. 6A) are generated, in which a drain current is abruptly increased at a certain voltage.

SUMMARY OF THE INVENTION

In order to solve the problems described above, an object of the present invention is to reduce series resistance through a semiconductor layer between a contact layer provided with an ohmic electrode and a channel layer in a field-effect semiconductor device having a heterojunction.

The field-effect semiconductor device comprises: a channel layer; a contact layer; a semiconductor structure having an electron-affinity different from those of the channel layer and the contact layer and formed between the channel layer and the contact layer; an ohmic electrode formed on the contact layer; and a Schottky electrode formed on the semiconductor structure. The junction face between the channel layer and the semiconductor structure and the junction face between the contact layer and the semiconductor structure are iso-type heterojunctions.

It is preferable that both materials for the channel layer and the semiconductor structure at the junction face therebetween are formed of n-type heavily doped layers, and that both materials for the contact layer and the semiconductor structure at the junction face therebetween are formed of n-type heavily doped layers. Further, both materials for the channel layer and the semiconductor layer at the junction face therebetween preferably have dopant concentration of $1\times10^{18}$ cm$^{-3}$ or more, and both materials for the contact layer and the semiconductor layer at the junction face therebetween preferably have dopant concentration of $1\times10^{18}$ cm$^{-3}$.

The semiconductor layer is preferably composed of a single material and has an electron-affinity smaller than those of the channel layer and the contact layer. According to a specific embodiment, the semiconductor layer is composed of AlGaAs, and the channel layer is composed of InGaAs.

According to the present invention, since the resistance through the heterojunction portion between the channel layer and the semiconductor layer thereon can be reduced, and the resistance through the heterojunction portion between the contact layer and the semiconductor layer thereunder can also be reduced, a field-effect semiconductor device having low series resistance can be realized. In addition, since the Schottky barrier height in the thermal equilibrium can be reduced, phenomena such as applied-voltage-dependent increases and decreases in current (drain current kink) can be suppressed. Accordingly, a device can be produced having device characteristics in which the maximum drain current and mutual conductance are improved, and on-resistance is decreased.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

DETAILED DESCRIPTION OF PREFERRED EMBODIMENTS

Figure 1:
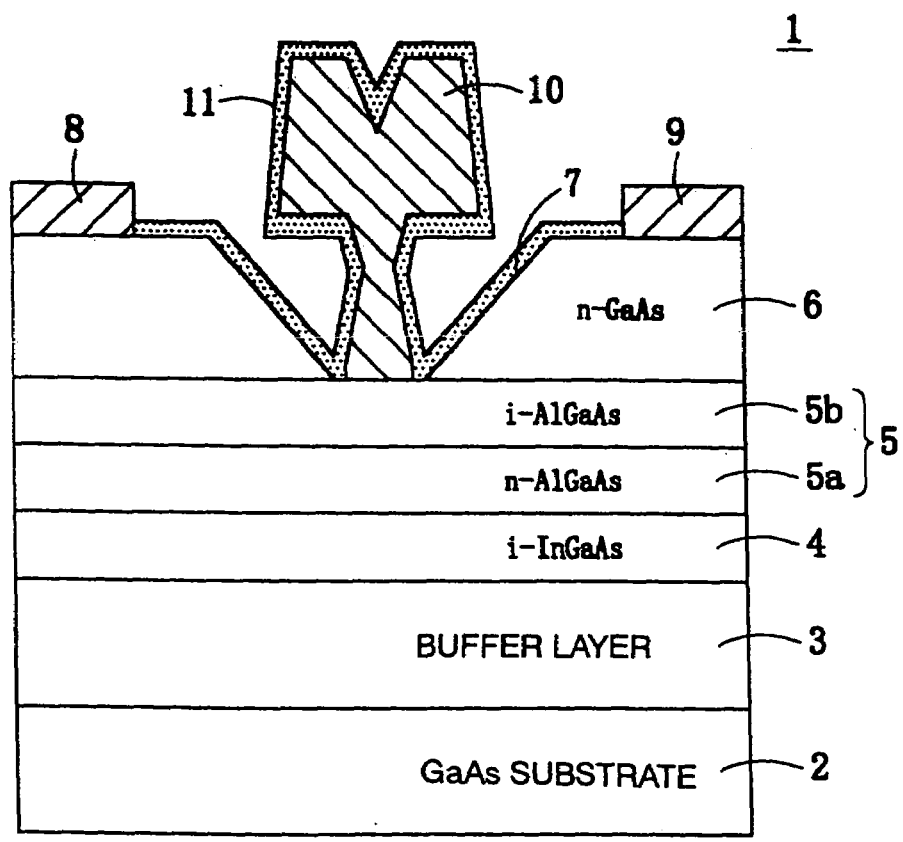
FIG. 1 is a schematic cross-sectional view showing the structure of a conventional HEMT.

A field-effect semiconductor device according to the present invention comprises a channel layer, a contact layer, a semiconductor structure which has an electron-affinity different from those of the channel layer and the contact layer and which is provided therebetween, ohmic electrodes provided on the contact layer, and a Schottky electrode provided on the semiconductor structure, in which the junction face between the channel layer and the semiconductor layer and the junction face between the contact layer and the semiconductor structure are iso-type heterojunctions.

An iso-type heterojunction is a heterojunction other than an aniso-type heterojunction. The aniso-type heterojunction is, as described above, a junction formed of semiconductors having conduction types different from each other, or a junction formed of materials having electrical conductances significantly different from each other. Junctions between an n-type semiconductor and a p-type semiconductor, an n-type semiconductor and an undoped semiconductor, a p-type semiconductor and an undoped semiconductor, and a heavily doped semiconductor layer ($n^+$, $p^+$) and a lightly doped semiconductor layer ($n^-$, $p^-$) may be considered as examples. As typical examples of aniso-type heterojunctions, there are n-AlGaAs/i-GaAs, n-AlGaAs/i-InGaAs, n-InGaP/i-GaAs, n-InGaP/i-InGaAs, n-InAlAs/i-InGaAs, n-GaAs/i-InGaAs, and the like, as n-type semiconductor materials having small electron affinities. As n-type semiconductor materials having great electron-affinities, i-AlGaAs/n-GaAs, i-AlGaAs/n-InGaAs, i-InGaP/n-GaAs, i-InGaP/n-InGaAs, i-InAlAs/n-InGaAs, i-GaAs/n-InGaAs, and the like are aniso-type heterojunctions.

Since an iso-type heterojunction is a heterojunction other than an aniso-type heterojunction, the iso-type heterojunction is a junction formed of semiconductors having the same conductive type and electrical conductances of materials therefor being not significantly different from each other. In addition, as typical examples of iso-type heterojunctions, there are n-AlGaAs/n-GaAs, n-AlGaAs/n-InGaAs, n-InGaP/n-GaAs, n-InGaP/n-InGaAs, n-InAlAs/n-InGaAs, n-GaAs/n-InGaAs (difference in electrical conductance thereof is assumed not to be significant), and the like. Furthermore, n-type/$n^+$-type, n-type/$n^-$-type, p-type/$p^+$-type, and p-type/$p^-$-type are also iso-type heterojunctions.

Similar to the field-effect semiconductor device according to the present invention, when the junction face formed of a channel layer and a semiconductor structure provided between the channel layer and a contact layer and the junction face formed of the contact layer and the semiconductor structure provided between the channel layer and the contact layer are both iso-type heterojunctions formed of materials having electron-affinities different from each other, the bottom of the conduction band in each heterojunction face does not significantly shift upward or downward with respect to the Fermi level, and hence, resistance through the heterojunction portion from the contact layer to the channel layer under the gate electrode can be decreased. Accordingly, without impairing the function of the barrier layer, the series resistance component in the field-effect semiconductor device can be decreased.

In particular, when both materials for the channel layer and the semiconductor structure at the junction face therebetween are formed of n-type heavily doped layers, and both materials for the contact layer and the semiconductor structure at the junction face therebetween are formed of n-type heavily doped layers, carrier mobility can be increased, and a field-effect semiconductor device which can be used in a high frequency region can be obtained.

In addition, in the field-effect semiconductor device of the present invention, for example, InGaAs may be used for the channel layer, and AlGaAs may be used for the semiconductor structure provided between the channel layer and the contact layer. However, the semiconductor structure is preferably composed of a single material having an electron-affinity smaller than those of the channel layer and the contact layer.

Furthermore, since a barrier height and an effective barrier thickness of iso-type heterojunction are determined primarily by differences in dopant concentration and an electron-affinity of materials forming the junction, when the dopant concentrations at the junction face of both materials forming the channel layer and the semiconductor structure are set to be $1 \times 10^{18}$ cm$^{-3}$ or more, and the dopant concentrations at the junction face of both materials forming the contact layer and the semiconductor structure are set to be $1 \times 10^{18}$ cm$^{-3}$ or more, the entire resistance component can be reduced.

Hereinafter, the preferred embodiments of the present invention are explained in more detail with reference to the drawings.

First Embodiment

Figure 4:
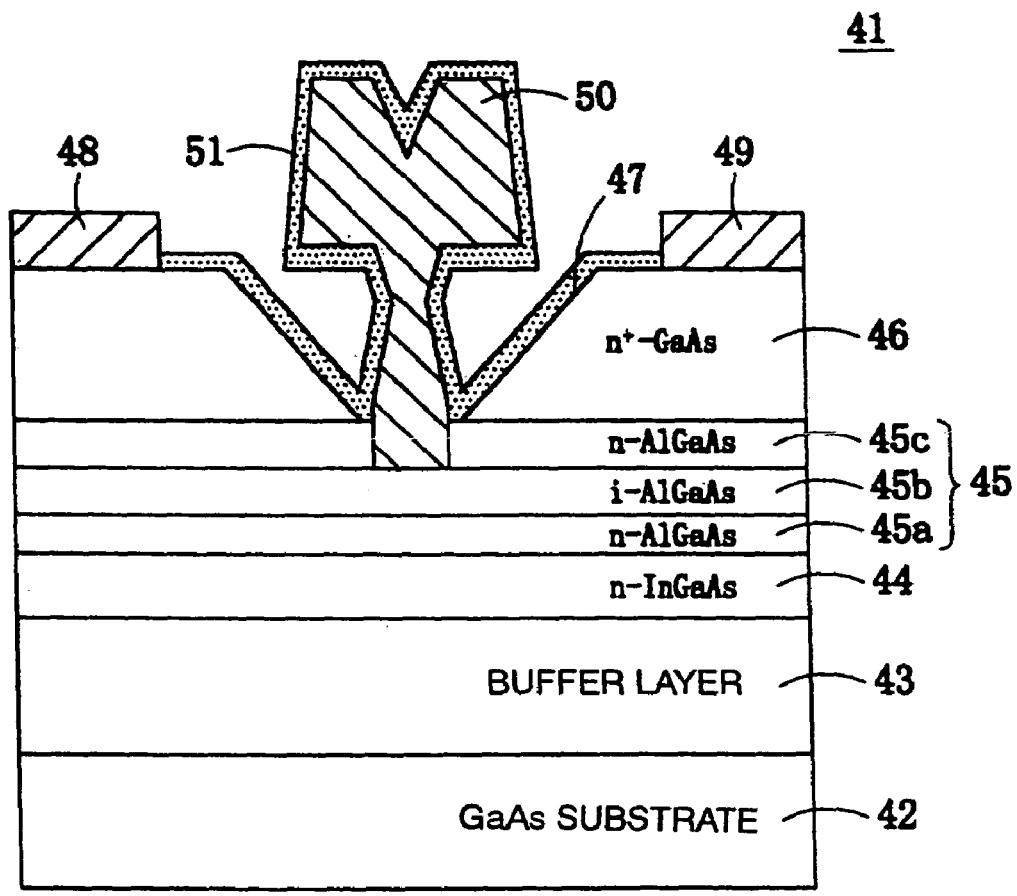
FIG. 4 is a schematic cross-sectional view showing a heterojunction FET according to an embodiment of the present invention.

FIG. 4 is a schematic cross-sectional view of the structure of a heterojunction HEMT 41 according to an embodiment of the present invention. In the HEMT 41, a buffer layer 43, a channel layer 44 which is 10 nm thick composed of n-type InGaAs (the dopant concentration is $2 \times 10^{18}$ cm$^{-3}$), a barrier layer 45, and a contact layer 46 which is 50 nm thick composed of $n^+$-type GaAs (the dopant concentration is $5 \times 10^{18}$ cm$^{-3}$) are formed in the order mentioned above on a semi-insulating GaAs substrate 42 by epitaxial growth using molecular beam epitaxy (MBE), metal-organic chemical vapor deposition (MOCVD), or the like. The barrier layer 45 is composed of, from the bottom thereof, an n-type AlGaAs layer 45a which is 10 nm thick (the dopant concentration is $3 \times 10^{18}$ cm$^{-3}$), an undoped AlGaAs film 45b which is 10 nm thick, and an n-type AlGaAs layer 54c which is 10 nm thick (the dopant concentration is $3 \times 10^{18}$ cm$^{-3}$).

Ohmic electrodes, which are used as a source electrode 48 and a drain electrode 49, are formed on the contact layer 46. The contact layer 46 between the source electrode 48 and the drain electrode 49 is removed by etching so as to from a recess. After a gate electrode 50 is formed on the n-type AlGaAs layer 45c that is exposed from the contact layer 46 in a recess 47, the bottom of the gate electrode is brought into contact with the undoped AlGaAs layer 45b by thermal diffusion so as to form a Schottky contact therewith. As a result, the bottom portion of the gate electrode 50 is buried in the n-type AlGaAs layer 45c. In this connection, when the gate electrode 50 is buried in the n-type AlGaAs barrier layer 45c, after etching the contact layer 46 so as to form a recess, a part of the n-type AlGaAs barrier layer 45c may be removed by anisotropic etching, and subsequently, the gate electrode 50 may be formed directly on an area at which the undoped AlGaAs layer 45b is exposed. The heterojunction FET 41 is finally protected with an insulating layer 51 composed of SiN or the like.

The heterojunction between the barrier layer 45 and the contact layer 46 is an iso-type heterojunction of n-type AlGaAs and $n^+$-type GaAs, and the channel layer 44 and the barrier layer 45 also form an iso-type heterojunction of n-type InGaAs and n-type AlGaAs.

Since the channel layer and the barrier layer may work so long as there is a difference in an electron-affinity between the materials therefor, in addition to the combination mentioned above, an iso-type heterojunction formed by a combination of InGaAs and InGaP having the same conduction type, or the like, may be used. In addition, instead of n-type InGaAs, n-type GaAs may be used for the channel layer 44. Furthermore, a double doped structure having a heavily doped layer as an electron-supplying layer provided under the channel layer 44 may be used.

The laminated structure of the barrier layer 45 may be an iso-type heterojunction structure composed of multiple films; however, it is preferable that the barrier layer 45 be composed of a single material (homo-junction) similar to the AlGaAs in the embodiment.

Figure 5:
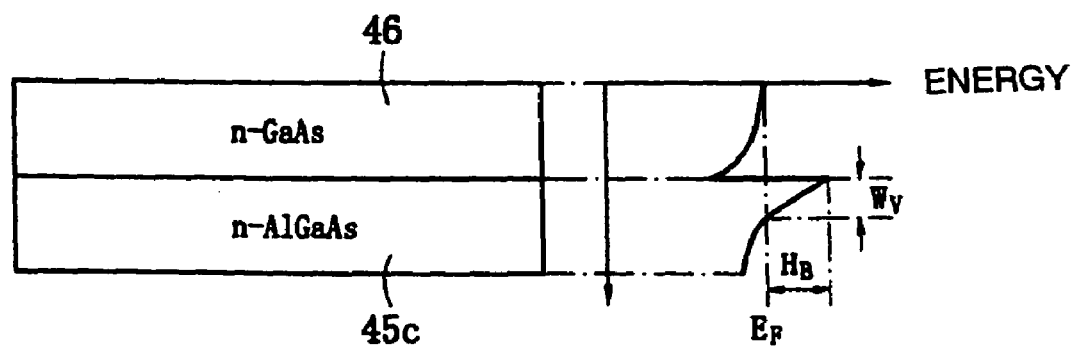
FIG. 5 is a view showing the energy band structure in the conduction band between a barrier layer and a contact layer in the thermal equilibrium.

In the embodiment, the barrier layer 45 having an electron-affinity different from those of the channel layer 44 and the contact layer 46 is formed therebetween, the junction face between the channel layer 44 and the barrier layer 45 is an iso-type heterojunction, and the junction face between the contact layer 46 and the barrier layer 45 is also an iso-type heterojunction. As described above, when both heterojunction faces between the channel layer 44 and the barrier layer 45 and between the contact layer 46 and the barrier layer 45 are iso-conduction type junctions, as shown in the energy band structure in FIG. 5 (the case of n-type GaAs and n-type AlGaAs is shown in FIG. 5, and the case of n-type InGaAs and n-type AlGaAs is also similar thereto), the bottom of the conduction band in the heterojunction region is positioned above and below the Fermi level at an approximately equivalent level therefrom. Consequently, the barrier height $H_B$, with respect to electrons, between the upper layer and the lower layer of the barrier layer 45 and the width of a depletion layer (effective barrier thickness) $W_v$ are decreased, so that the resistance through the heterojunction from the contact layer 46 to the channel layer 44 under the gate electrode 50, that is, the series resistance component in the heterojunction FET 41, can be reduced without impairing the function of the barrier layer 45.

Since the barrier height $H_B$ and the effective barrier thickness $W_v$ of the iso-type heterojunction as described above are determined primarily by the difference in dopant concentration and difference in an electron-affinity of materials forming the junction, in order to reduce the entire resistance component, the dopant concentrations of the channel layer 44, the barrier layer 45, and the contact layer 46 are preferably $1 \times 10^{18}$ cm$^{-3}$ or more.

Figure 2:
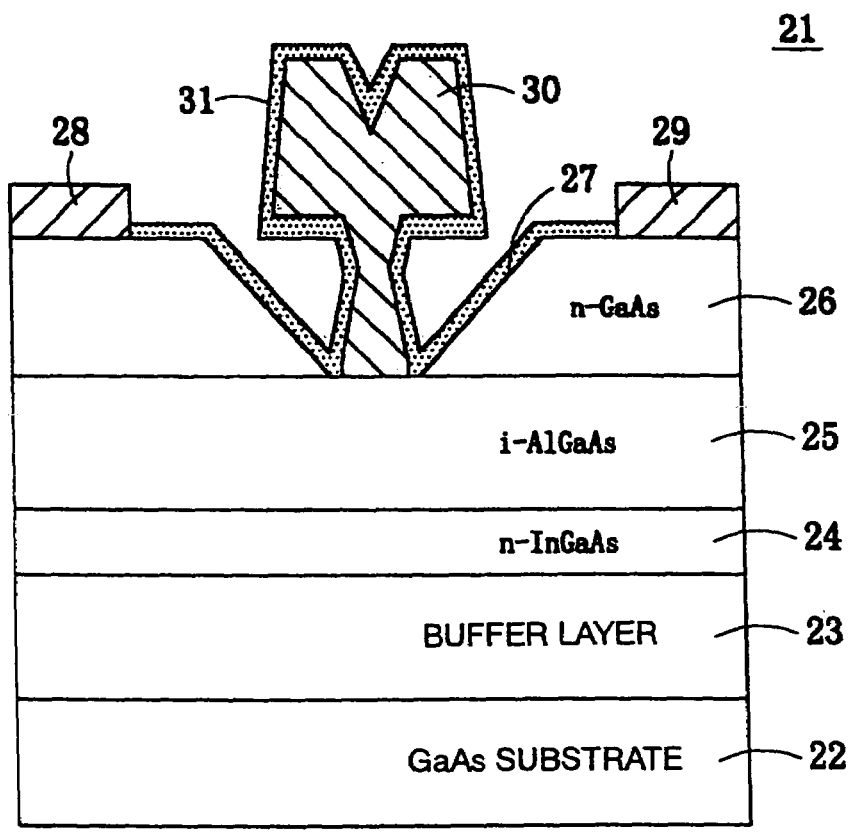
FIG. 2 is a schematic cross-sectional view showing the structure of a conventional DMT.
Figure 3A:
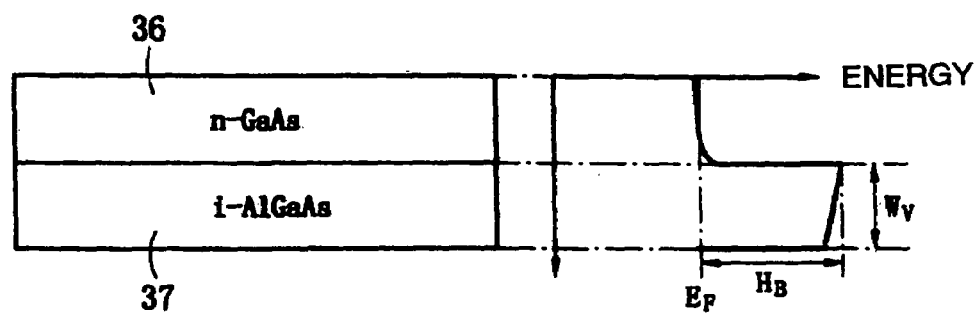
FIGS. 3A and 3B are views each showing the energy band structure in the conduction band in the vicinity of an aniso-type heterojunction in the thermal equilibrium.
Figure 3B:
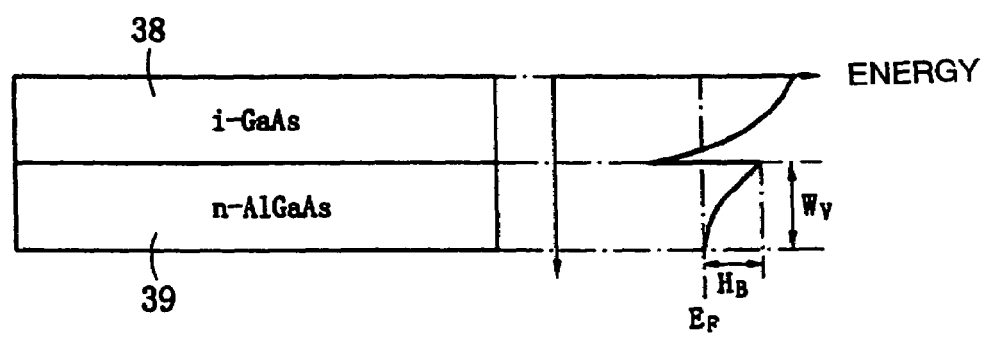
Figure 6A:
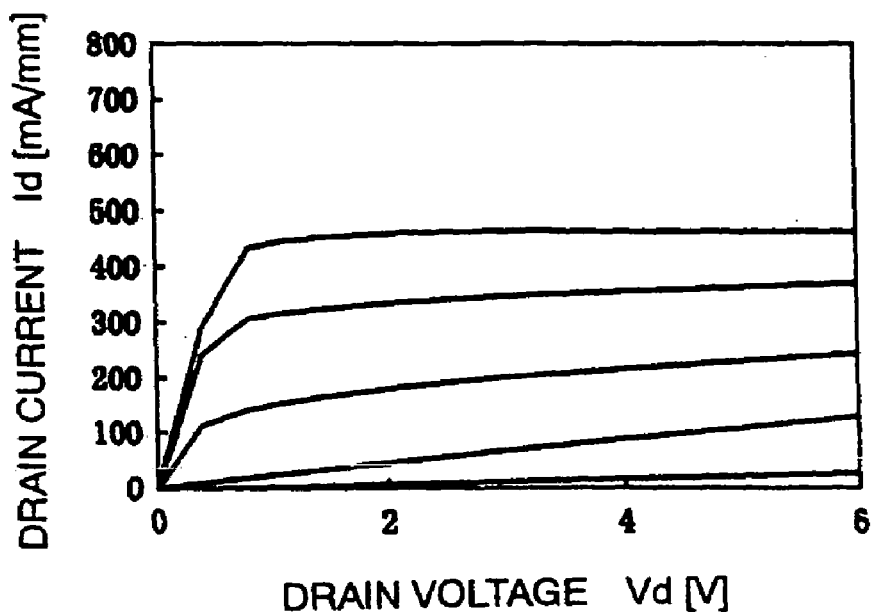
FIG. 6A is a graph showing the current-voltage characteristics of an HEMT according to an embodiment of the present invention.
Figure 6B:
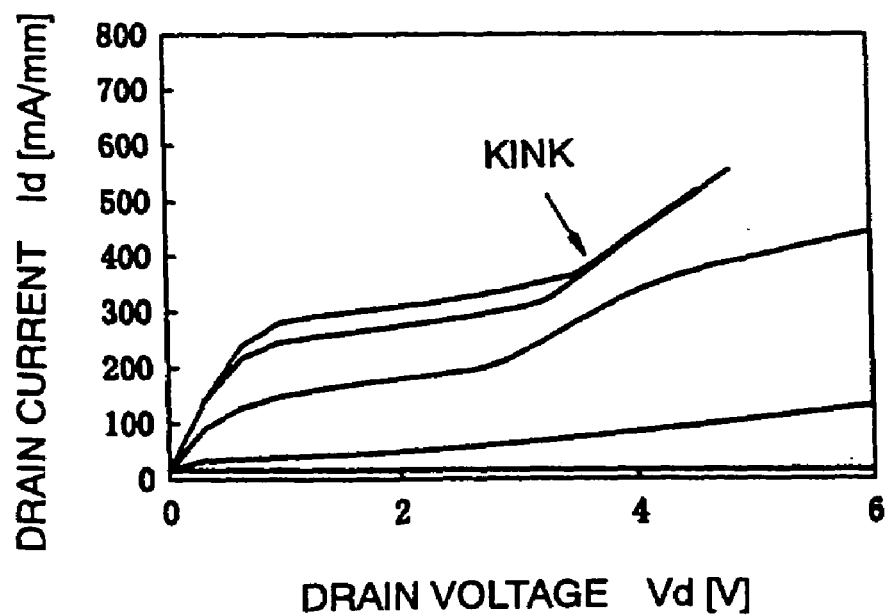
FIG. 6B is a graph showing the current-voltage characteristics of a DMT of a conventional example.

FIG. 6A is a graph showing the current-voltage characteristics of the structure according to an embodiment of the present invention similar to that shown in FIG. 4. FIG. 6B is a graph showing the current-voltage characteristics of a conventional DMT having a structure similar to that shown in FIG. 2. Both graphs show the changes in drain current versus the drain voltage. A drain current kink was observed in the current-voltage characteristics shown in FIG. 6B obtained from the conventional example, and on the other hand, it is understood from the current-voltage characteristics shown in FIG. 6A obtained from the example of the present invention that no kink is observed and a high current can be obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A field-effect semiconductor device comprising:
 a channel layer;
 a contact layer;
 a semiconductor structure having an electron-affinity different from those of the channel layer and the contact layer and formed between the channel layer and the contact layer, the semiconductor structure having a first junction face between the semiconductor structure and the channel layer and having a second junction face between the semiconductor structure and the contact layer;
 an ohmic electrode formed on the contact layer; and
 a Schottky electrode formed on the semiconductor structure; wherein
 both of the first junction face and the second junction face are iso-type heterojunctions;
 the semiconductor structure is composed of a single material and includes at least three semiconductor layers;
 the first junction face between the channel layer and the semiconductor structure and the second junction face between the contact layer and the semiconductor structure are iso-type heterojunctions;
 the channel layer and the semiconductor structure at the first junction face are each formed of doped layers;
 the contact layer and the semiconductor structure at the second junction face are each formed of doped layers; and
 the semiconductor structure includes an undoped layer intermediate the dosed layers thereof.

2. A field-effect semiconductor device according to claim 1, wherein the channel layer and the doped layer of the semiconductor structure at the first junction face are each n-type doped layers, and the contact layer and the doped layer of the semiconductor structure at the second junction face are each n-type doped layers.

3. A field-effect semiconductor device according to claim 2, wherein the channel layer and the semiconductor structure at the first junction face each have a dopant concentration of $1 \times 10^{18}$ cm$^{-3}$, and the contact layer and the semiconductor structure at the second junction face each have a dopant concentration of $1 \times 10^{18}$ cm$^{-3}$.

4. A field-effect semiconductor device according to claims 1 or 2, wherein the electron-affinity of the semiconductor structure is smaller than those of the channel layer and the contact layer.

5. A field-effect semiconductor device according to claim 3, wherein the electron-affinity of the semiconductor structure is smaller than those of the channel layer and the contact layer.

6. A field-effect semiconductor device according to claim 4, wherein the semiconductor structure is composed of AlGaAs.

7. A field-effect semiconductor device according to claim 5, wherein the semiconductor structure is composed of AlGaAs.

8. A field-effect semiconductor device according to claims 1, 2 or 3, wherein the channel layer is composed of InGaAs.

9. A field-effect semiconductor device according to claim 8, wherein the electron-affinity of the semiconductor structure is smaller than those of the channel layer and the contact layer.

10. A field-effect semiconductor device according to claim 8, wherein the semiconductor structure is composed of AlGaAs.

11. A field-effect semiconductor device according to claim 1, wherein the Schottky electrode is in contact with the undoped layer.

12. A field-effect semiconductor device according to claim 11, wherein the channel layer and the doped layer of the semiconductor structure at the first junction face are each n-type doped layers, and the contact layer and the doped layer of the semiconductor structure at the second junction face are each n-type doped layers.

* * * * *